(12) United States Patent
Corredoura et al.

(10) Patent No.: US 11,549,973 B1
(45) Date of Patent: Jan. 10, 2023

(54) SYSTEM FOR MEASURING VOLTAGE USING PULSE WIDTH MODULATOR OR VOLTAGE CONTROLLED OSCILLATOR

(71) Applicant: Keysight Technologies, Inc., Santa Rosa, CA (US)

(72) Inventors: Paul L. Corredoura, Redwood City, CA (US); Nathaniel Guilar, San Carlos, CA (US); Robert M. Neff, Palo Alto, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 17/412,658

(22) Filed: Aug. 26, 2021

(51) Int. Cl.
*G01R 19/25* (2006.01)
*G01R 19/165* (2006.01)

(52) U.S. Cl.
CPC ... *G01R 19/2503* (2013.01); *G01R 19/16523* (2013.01); *G01R 19/16557* (2013.01); *G01R 19/16519* (2013.01)

(58) Field of Classification Search
CPC .......... G01R 19/2503; G01R 19/16523; G01R 19/16557; G01R 19/16519
See application file for complete search history.

(56) References Cited

U.S. PATENT DOCUMENTS

| | | | |
|---|---|---|---|
| 7,809,517 B1* | 10/2010 | Zuckerman | H03L 7/07 702/187 |
| 10,935,611 B2* | 3/2021 | Hahn | G01N 22/00 |
| 2010/0117668 A1* | 5/2010 | Redlich | G01R 31/3025 324/756.07 |
| 2013/0334405 A1* | 12/2013 | Iwasa | G01R 33/36 250/214.1 |
| 2019/0037310 A1* | 1/2019 | Quan | H04R 3/04 |

FOREIGN PATENT DOCUMENTS

| | | |
|---|---|---|
| CN | 2031984 U | 2/1989 |
| CN | 203502480 U | 3/2014 |
| CN | 209961826 U | 1/2020 |

OTHER PUBLICATIONS

English translation of CN203502480U, 7 pgs.
English translation of CN2031984U, 7 pgs.
(Continued)

*Primary Examiner* — Dominic E Hawkins

(57) ABSTRACT

A system for measuring voltage includes a pulse-width modulator or voltage controlled oscillator (VCO) configured to receive an input voltage waveform from a DUT, and to output a pulse-width modulated (PWM) signal or frequency modulated (FM) signal mapped to the input voltage waveform, respectively; an optical transmitter configured to be modulated by the PWM signal or the FM signal to output an optical pulse signal having pulse widths corresponding to pulse widths of the PWM signal or equal to the frequency of the FM signal, respectively; an optical receiver configured to receive the optical pulse signal over an optical link and to convert the optical pulse signal to an electrical current; a transimpedance amplifier (TIA) configured to convert the electrical current to a voltage signal; and at least one filter or detection circuit configured to recover the input voltage waveform or provide numeric values corresponding to the input voltage waveform.

20 Claims, 6 Drawing Sheets

(56) References Cited

OTHER PUBLICATIONS

Bjorn Franzen, "A Differential Measurement Probe with High Common Mode Rejection", Division of Industrial Electrical Engineering and Automation, Oct. 2018, pp. 1-80.

Xui-qian He et al., "An optoelectronic voltage sensor based on timer chip and pulse duration ratio modulation", Journal of Optoelectronics Laser, vol. 31, No. 9, Sep. 2020, pp. 909-914 (English translation included).

English translation of CN209961826U, 8 pgs.

* cited by examiner

SYSTEM FOR MEASURING VOLTAGE USING PULSE WIDTH MODULATOR OR VOLTAGE CONTROLLED OSCILLATOR

BACKGROUND

Conventional voltage measurement systems are not able to provide measurements involving an isolated remote voltage probe, where the probed voltage is in a high voltage floating environment, and measurement instrument is at ground level. For example, in a measurement use case involving electric vehicle power train electronics, high-power field-effect transistors (FETs) convert stored battery power into the three-phase electrical drive powering the drive motors. High-side FETs connected to the battery voltage present a challenge for measuring gate-to-source voltage (Vgs) (gate control voltage of the FET with respect to the source node voltage) because the common-mode source voltage changes with a fast slew rate. This requires a differential voltage measurement across the gate-source nodes with very high common mode rejection. To achieve this requirement, the measurement system must have low capacitance, implying a physically small size. Also, the probe of the measurement system must be electrically isolated from the receive side and the measurement host (test instrument), which is receiving the probed signals, because the source voltage of the high-side FETs can slew between the battery voltage and close to ground.

Attempts have been made to address this measurement challenge using an amplitude modulated laser. While amplitude modulated lasers may meet some isolation and bandwidth requirements of the measurement, achieving accurate direct current (DC) measurements is challenging. This is because lithium niobate based optical modulators commonly used in optically modulated systems have inherent charge storage effects that alter their DC responsivity and can exhibit measurement drifts. To get around this flaw, additional circuits containing a slow traditional analog-to-digital converter (ADC) and another communication path are used to accurately capture the DC portion of a measurement. This adds costs and complexity at both the probe side and the receive side that typically connects to an oscilloscope channel.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
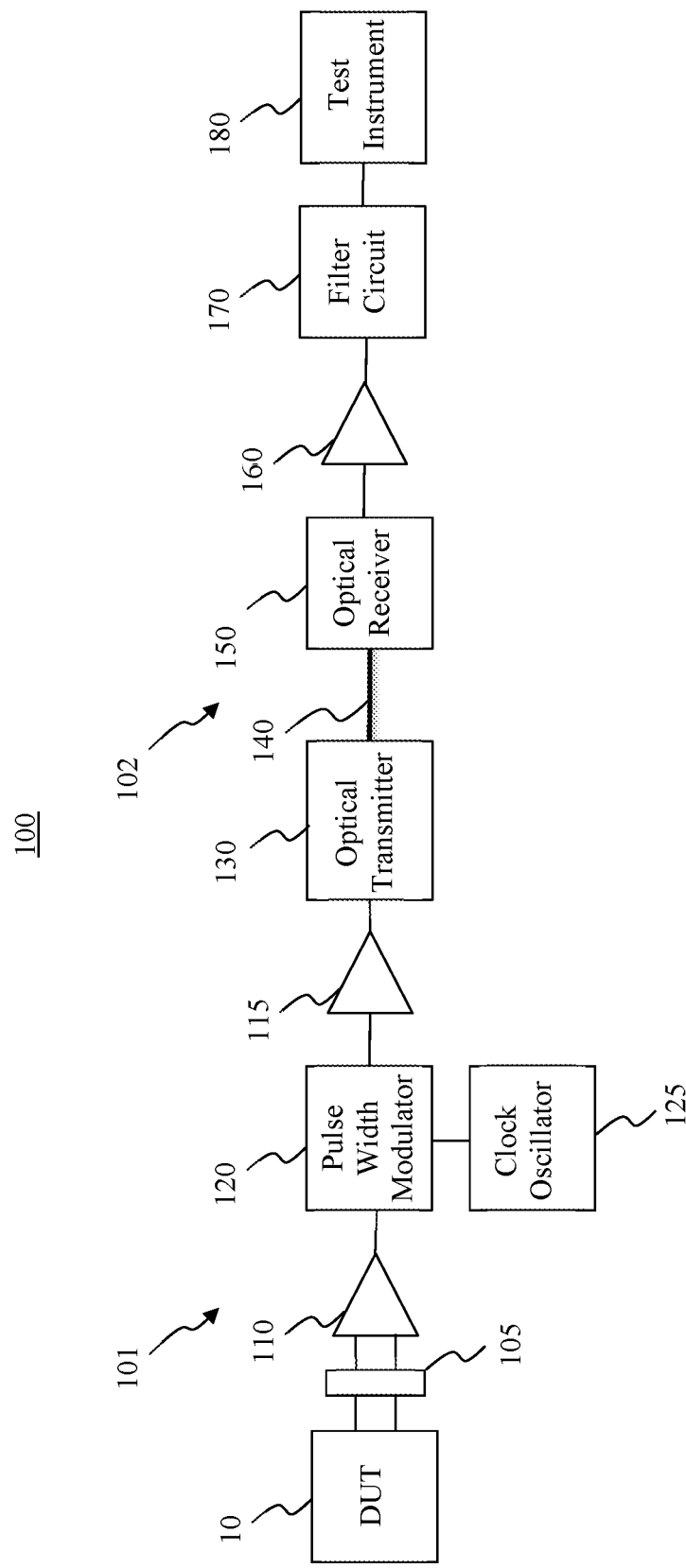
FIG. 1 is a simplified block diagram of a system for measuring voltage in a device under test (DUT) using a pulse-width modulator, according to a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one having ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

According to a representative embodiment, a system is provided for measuring voltage, including a pulse-width modulator configured to receive an input voltage waveform from a device under test (DUT), and to output a PWM signal mapped to the input voltage waveform; an optical transmitter configured to be modulated by the PWM signal to output an optical pulse signal having pulse widths corresponding to pulse widths of the PWM signal; an optical receiver configured to receive the optical pulse signal over an optical link and to convert the optical pulse signal to an electrical current; a transimpedance amplifier (TIA) configured to convert the electrical current to a voltage signal; and at least one filter configured to filter the voltage signal to recover the input voltage waveform from the DUT.

According to another representative embodiment, a system is provided for measuring voltage, including a voltage controlled oscillator (VCO) configured to receive an analog input voltage waveform from a DUT, and to output a VCO signal having a frequency mapped to the analog input voltage waveform, where the frequency of the VCO signal is at least twice that of a required measurement bandwidth of the analog input voltage waveform being measured; and a detection circuit configured to convert the VCO signal to numeric values, corresponding to voltage levels of the analog voltage input waveform from the DUT, based on the frequency of the VCO signal.

According to another representative embodiment, a system is provided for measuring voltage, including a VCO configured to receive an input voltage waveform from a DUT, and to output a VCO signal having a frequency mapped to the input voltage waveform, where the frequency of the VCO signal is at least twice the measurement bandwidth of the input voltage waveform; an optical transmitter configured to be modulated by the frequency of the VCO signal to output an optical pulse signal having a pulse rate equal to the frequency of the VCO signal; an optical receiver configured to receive the optical pulse signal over an optical link and to convert the optical pulse signal to an electrical current; a transimpedance amplifier (TIA) configured to convert the electrical current to a voltage signal corresponding to the VCO signal; and a detection circuit configured to convert the voltage signal into an output voltage waveform having the same frequency as the VCO signal, or to convert the voltage signal to numeric values corresponding to voltage levels of the input voltage waveform.

Generally, according to various embodiments, measured voltage of an input voltage waveform (differential or single-ended) is mapped to a pulse width modulation (PWM) instead of amplitude modulation (AM) of an optical transmitter, such as a laser diode or an optical modulator. A constant frequency oscillator generates a clock signal that has a clock frequency at least twice the frequency of the required measurement bandwidth to meet Nyquist constraints. In practice, a safety margin is additionally applied to allow for any filters that have a finite transition bandwidth. It is common to sample at 2.5 times the required bandwidth (or more).

FIG. 1 is a simplified block diagram of a system for measuring voltage in a DUT, according to a representative embodiment.

Referring to FIG. 1, system 100 includes a transmit side circuit 101 and a receive side circuit 102 connected the transmit side circuit 101 by an optical link 140. The transmit side circuit 101 is configured to output an optical pulse signal representative of an input voltage waveform received from a DUT 10, and the receive side circuit 102 is configured to convert the optical pulse signal received to a voltage that can be measured by a test instrument 180, such as an oscilloscope, a spectrum analyzer, or a digital multimeter, for example.

The transmit side circuit 101 of the system 100 includes a differential amplifier 110, a pulse-width modulator 120, and a fast clock oscillator 125. The differential amplifier 110 is configured to receive and amplify a differential analog input voltage waveform from the DUT 10 through a probe 105 and an optional attenuation and protection circuit (not shown). The DUT 10 may generate the input voltage waveform directly, or may provide the input voltage waveform in response to a stimulus signal. In the depicted embodiment, the input voltage waveform is a differential signal, in which case the probe 105 is a differential probe. However, it is understood that the input voltage waveform may be a single-ended single, without departing from the scope of the present teachings.

The pulse-width modulator 120 is configured to receive the amplified input voltage waveform from the differential amplifier 110, and to output a pulse-width modulated (PWM) signal mapped to the analog input voltage waveform. That is, the pulse-width modulator 120 produces an output pulse train having pulse widths that are proportional to voltage levels of the input voltage waveform. For example, a PWM duty cycle of the PWM signal produced by the pulse-width modulator 120 may range from 25 percent to 75 percent in correspondence with the analog voltage levels. The pulse-width modulator 120 is driven by a clock signal generated by the clock oscillator 125. In order to meet Nyquist constraints, the clock oscillator 125 generates the clock signal at a constant clock frequency that is at least twice the frequency of a required measurement bandwidth of the pulse-width modulator 120. Generally, the well known Nyquist requirement provides that a signal of bandwidth B must be sampled at a sampling rate of at least twice B to prevent aliasing. As a practical matter, a safety margin may be additionally applied, e.g., to accommodate filters that that have finite transition bandwidths, such that the frequency of the clock signal may be about 2.5 times the frequency of the required measurement bandwidth. For example, when the desired measurement bandwidth is 1 GHz, the clock signal must be greater than 2 GHz, and allowing for finite anti-aliasing filter cutoff, may require sampling at 2.5 GHz, for example. Of course, the frequency of the clock signal may vary in relation to the measurement bandwidth to provide unique benefits for any particular situation or to meet application specific design requirements of various implementations, as would be apparent to one skilled in the art.

The transmit side circuit 101 further includes a radio frequency (RF) amplifier 115 and an optical transmitter 130.

The RF amplifier 115 is configured to amplify the PWM signal output by the pulse-width modulator 120. The optical transmitter 130 converts the amplified PWM signal to an optical pulse signal having pulse widths that correspond to the pulse widths of the amplified PWM signal. The optical transmitter 130 may be a directly modulated laser diode or a laser diode followed by an optical modulator, for example, although any compatible type of optical transmitter 130 that includes a PWM modulated laser may be implemented without departing from the scope of the present teachings. As mentioned above, when optical transmitter 130 is a laser diode without an additional optical modulator, the laser diode is directly modulated by the PWM signal to output the optical pulse signal.

The output of the optical transmitter 130 is connected to the optical link 140, which is configured to transmit the optical pulse signal to the receive side circuit 102. The optical link 140 enables measurement of a differential input voltage waveform that is floating on a high voltage, which would otherwise typically be beyond the capabilities of the test instrument 180, as discussed below. Also, the optical link 140 enables the optical pulse signal to be transported over a long distance without loss of signal quality.

The receive side circuit 102 includes an optical receiver 150, a transimpedance amplifier (TIA) 160, and a filter circuit 170. The optical receiver 150 is configured to receive the optical pulse signal over the optical link 140, and to convert the optical pulse signal to an electrical current signal. The TIA 160 is configured to convert the current signal into a voltage signal, and may also amplify the voltage signal. In various embodiments, the TIA 160 may be replaced by any compatible current to voltage converter, such as a resistor, for example, configured to convert the current signal into the voltage signal. The optical receiver 150 may comprise a photo diode with proper biasing, for example, although any compatible type of optical receiver 150 may be implemented without departing from the scope of the present teachings. As mentioned above, the transmit side circuit 101 may be operating on a high voltage floating environment, while the receive side circuit 102 still may be at ground level since the optical link 140 does not conduct electrical current.

The filter circuit 170 includes at least one filter configured to receive the amplified voltage signal output by the TIA 160, and to filter out the signals above the desired bandwidth. For example, the filter circuit 170 may include a low-pass filter and optionally notch filters set to further remove the clock signal and any strong harmonics of the clock frequency. The low-pass filter blocks portions of the voltage signal having frequency components greater than or equal to one half of the clock frequency of the clock signal generated by the clock oscillator 125, and passes desired signals from the DUT 10 limited by the Nyquist requirement set by the clock frequency. The output of the filter circuit 170 is an output voltage waveform corresponding to the input voltage waveform originally provided by the DUT 10, thereby recovering the input voltage waveform. The output voltage waveform is provided to the test instrument 180, which may perform measurements and other processing on the output voltage waveform. The test instrument 180 may include a display configured to display the output voltage waveform. Because of the optical link 140, the test instrument 180 may be a standard oscilloscope, for example, which is able to perform wideband measurements even when the DUT 10 operates at high voltages, e.g., greater than 100V. Basic offset and gain calibration allows the oscilloscope to display the output voltage waveform corresponding to the originally probed input voltage waveform.

Similarly, a system may be configured to map an input voltage waveform being measured into a frequency modulated signal as opposed to a pulse-width modulated signal, and then converted back to the input voltage waveform or to numerical values representing the input voltage waveform. Such a system includes a VCO instead of a pulse pulse-width modulator. Notably, conventional inductor capacitor (LC) resonator-based VCOs are not able to tune with required speeds (e.g., 1 GHz desired measurement bandwidth) due to the narrow band resonators. According to embodiments herein, high speed VCOs, such as fast ring oscillators, are tuned to new frequencies very quickly.

Figure 2:
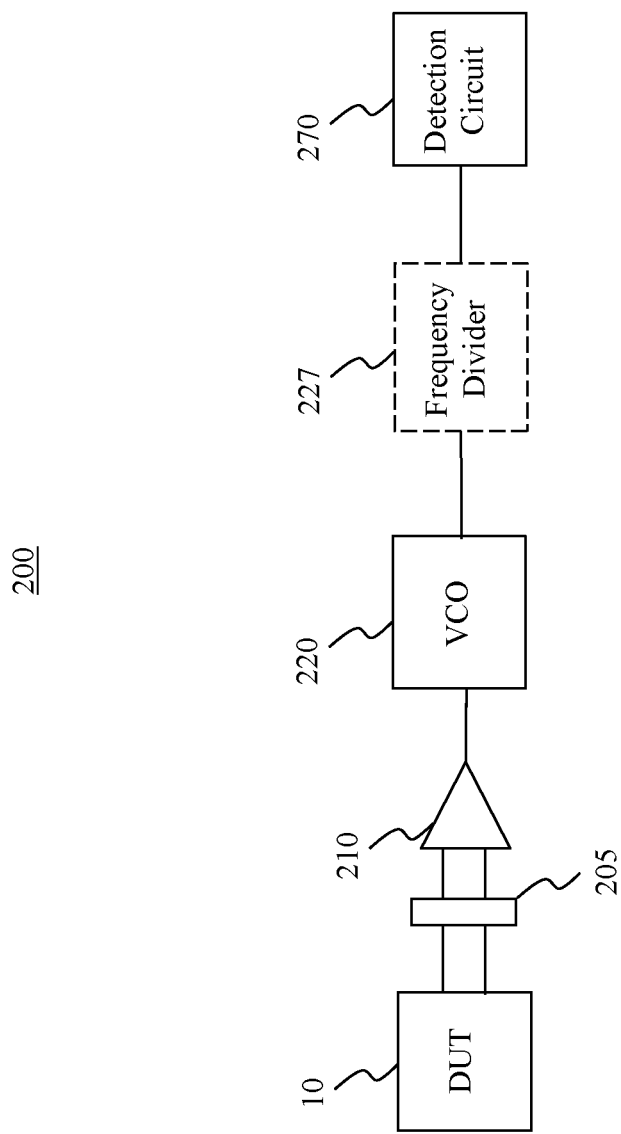
FIG. 2 is a simplified block diagram of a system for measuring voltage using a voltage controlled oscillator (VCO) to convert analog voltage to numeric values, according to a representative embodiment.

FIG. 2 is a simplified block diagram of a system for measuring voltage using a voltage controlled oscillator (VCO) to convert analog voltage to numeric values, according to a representative embodiment.

Referring to FIG. 2, a system 200 includes a differential amplifier 210, a voltage controlled oscillator (VCO) 220, an optional frequency divider 227, and a frequency detection circuit 270. The differential amplifier 210 is configured to receive and buffer or amplify an analog input voltage waveform from a DUT or other voltage source through a probe 205 and an optional attenuation and protection circuit (not shown). In the depicted embodiment, the input voltage waveform is a differential signal, in which case the probe 205 is a differential probe. However, it is understood that the input voltage waveform may be a single-ended single, without departing from the scope of the present teachings.

The VCO 220 is configured to receive the amplified analog input voltage waveform, and to output a VCO signal, which is a frequency modulated (FM) clock signal having a frequency that is mapped to the input voltage waveform. That is, as voltage level of the input voltage signal changes, the frequency output by the VCO 220 changes proportionately as a function of the voltage level, such that the frequency of the VCO signal is indicative of the voltage level. In an embodiment, the VCO 220 may be a ring oscillator VCO, which can be tuned to output new frequencies very quickly. Ring oscillator VCOs are discussed below with reference to FIG. 5.

The VCO 220 generates the VCO signal at a frequency that is at least twice the frequency of a required measurement bandwidth across the full range of tuning voltages in order to meet Nyquist constraints. For example, the VCO signal may be about 2.5 times the frequency of the required measurement bandwidth, although the frequency of the VCO signal in relation to the measurement bandwidth may vary to provide unique benefits for any particular situation or to meet application specific design requirements of various implementations, as would be apparent to one skilled in the art. The Nyquist requirement of sampling 2 to 2.5 times the frequency of the required measurement bandwidth must be applied to the minimum VCO frequency used. Accordingly, the VCO 220 is able to provide an output signal having a frequency tuning range that extends from a minimum frequency of at least twice the desired measurement bandwidth for the low range of the tuning voltage input to a higher frequency for the upper end of the tuning voltage range. The sensitivity of the VCO tuning is a design parameter that can be tailored for specific applications. In comparison, conventional systems that convert analog voltage waveforms to a frequency use a phase locked loop (PLL) to recover the original voltage from the frequency signal, are relatively slow and limit measurement bandwidth to about 100 MHz due to finite delays of the loop elements. An analog feedback loop (like a PLL) must have a total loop delay lower than half of the clock frequency period. So, a 100 MHz bandwidth loop must have loop delay that is less than 5 nanoseconds. This places a practical limit on PLLs caused by the finite delays of the loop elements.

When included, the frequency divider 227 is configured to divide down the frequency of the VCO signal output by the VCO 220 before the VCO signal is input to the detection circuit 270. By dividing down the VCO signal frequency, the frequency divider 227 reduces phase noise and related time-domain jitter of the otherwise raw VCO signal. The frequency divider 227 may be used to improve system jitter and phase noise performance.

The detection circuit 270 is configured to receive the VCO signal output by the VCO 220 (or the frequency divided VCO signal output by the frequency divider 227), and to convert the VCO signal to numeric values that correspond to the voltage levels of the analog input voltage waveform based on the frequency of the VCO signal. Accordingly, the system 200 effectively acts as an analog to digital converter, converting the analog input voltage received at the VCO 220 to corresponding numeric (digital) values. Offset and gain corrections can be applied to calibrate the system.

Figures 3A, 3B:
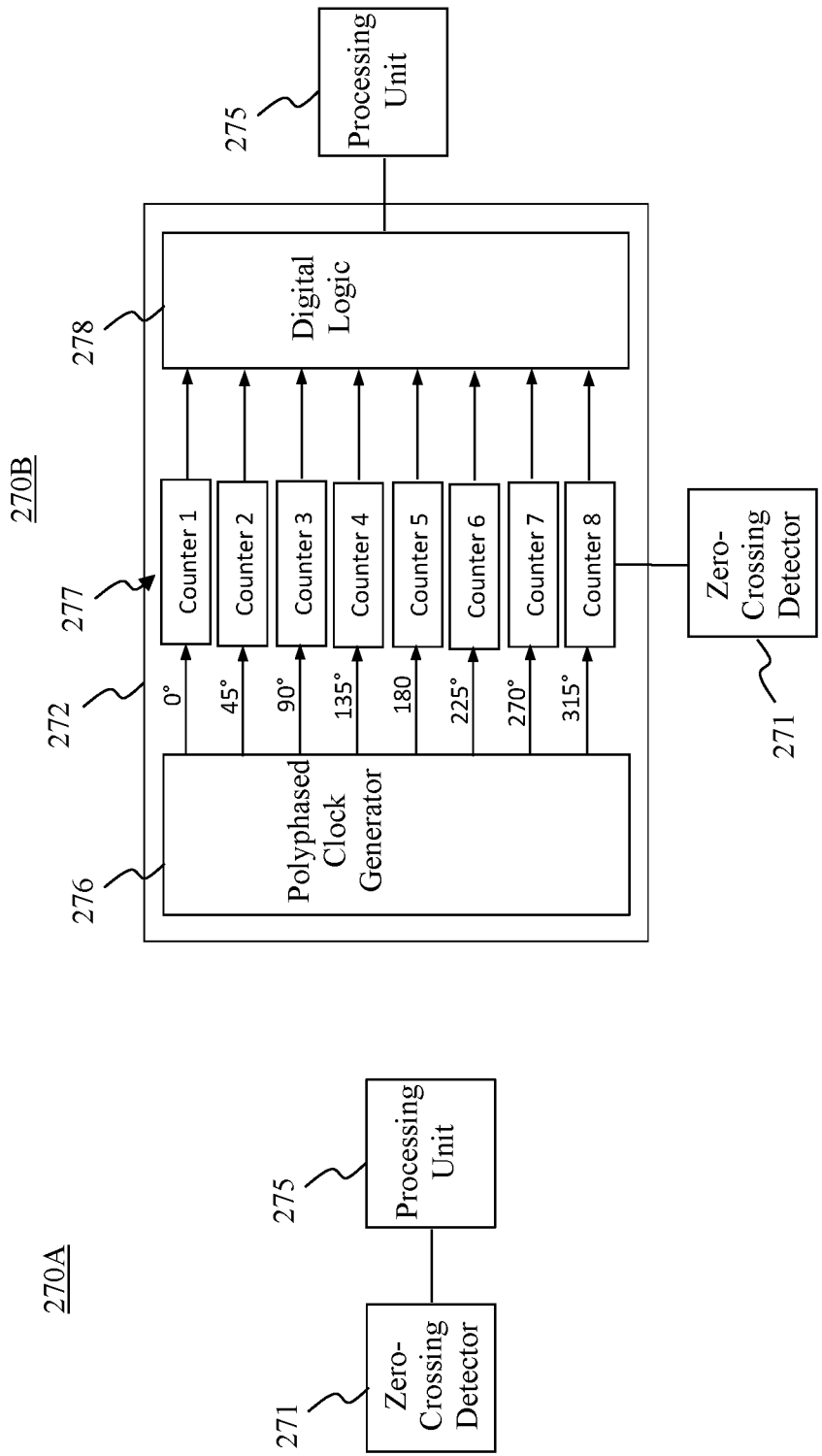
FIG. 3A is a simplified block diagram of a detection circuit, including a zero-crossing detection circuit and a processing unit, according to a representative embodiment.
FIG. 3B is a simplified block diagram of a detection circuit, including a zero-crossing detector, a polyphased time interval detector and a processing unit, according to a representative embodiment.

FIGS. 3A and 3B are simplified block diagrams showing examples of the detection circuit 270, discussed above, according to representative embodiments.

FIG. 3A shows detection circuit 270A, which includes a zero-crossing detector 271 and a processing unit 275. The zero-crossing detector 271 is configured to detect zero crossings of the VCO signal to identify the period of the VCO signal. In particular, the zero-crossing detector 271 detects zero crossings corresponding consecutive rising or falling edges of the VCO signal, and directly measures the period of the VCO signal based on these detected zero crossings. The accuracy of the zero crossing detection sets the resolution of the measurement and the lower value of the dynamic range. The processing unit 275 is configured to determine the frequency of the VCO signal based on the inverse of the measured periods provided by the zero-crossing detector 271, and to determine the numeric values corresponding to the voltage levels of the analog input voltage waveform based on the frequency of the VCO signal. The processing unit 275 may determine the numeric values using a look-up table, for example, that relates the frequency to the numeric values. The look-up table is also able to correct for non-linearities. Alternatively, the processing unit 275 may calculate the numeric values using a predetermined algorithm (e.g., a polynomial) that provides the numeric values using the measured frequency as input. A typical algorithm allows for offset removal and gain correction (both linear and non-linear gain corrections can be supported). In various embodiments, the zero-crossing detector 271 and/or the processing unit 275 may be incorporated into a test instrument, such as the test instrument 180, discussed above.

The processing unit 275 may be a digital signal processor (DSP), for example, with non-transitory memory that stores instructions for controlling operations of the DSP, including execution of the predetermined algorithm, when included. The memory may also store the look-up table, polynomials or other DSP methods, when included, and instructions for implementing the same.

Of course, alternative implementations of the processing unit 275 may be provided without departing from the scope of the present teachings. That is, the processing unit 275 may include one or more field-programmable gate arrays (FPGAs) and application specific integrated circuits (ASICs), or combinations thereof, using any combination of hardware, software, firmware, hard-wired logic circuits, or combinations thereof. Alternatively, or in addition, the processing unit 275 may include one or more state machines, computer processors and/or DSPs, discussed above. Associated memory may be any type or combination of tangible and non-transitory storage media (e.g., as compared to transitory propagating signals), including random-access memory (RAM), read-only memory (ROM), flash memory, static RAM (SRAM), dynamic RAM (DRAM), registers, or universal serial bus (USB) driver, or any other form of storage medium known in the art, for example. Memories may be volatile or non-volatile, secure and/or encrypted, unsecure and/or unencrypted, and may be embedded within or separate from the processing unit 275, without departing from the scope of the present teachings.

FIG. 3B shows detection circuit 270B, which includes a zero-crossing detector 271, a polyphased time interval detector 272, and a processing unit 275, where the polyphased time interval detector 272 enables higher resolution measurements of the VCO signal frequency by effectively increasing the clock frequency (higher resolution clock) using different clock phases. This may be helpful, for example, when a maximum rate of delay interval counters is limited by hardware. The zero-crossing detector 271 is configured to detect zero crossings of the VCO signal, and to control counters in the polyphased time interval detector 272 using the detected zero crossings. The processing unit 275 is configured to determine the frequency of the VCO signal based on the higher resolution measurements of the period by the polyphased time interval detector 272, and to determine the numeric values corresponding to the voltage levels of the analog input voltage waveform from the frequency of the VCO signal. As discussed above, the processing unit 275 may determine the numeric values using a look-up table, for example, that relates the frequency to the numeric values, or may calculate the numeric values using a predetermined algorithm (e.g., a polynomial) that provides the numeric values using the voltage levels as input.

The polyphased time interval detector 272 includes a polyphased clock generator 276, a counter bank 277, and a digital logic circuit 278. The polyphased clock generator 276 is configured to generate multiple clock signals with the same frequency, but with offset phases that provide improved (higher) timing resolution, i.e., less than a single clock interval, while keeping clock rates realizable. So, the minimum detectable time interval is the clock frequency divided by the polyphase factor. For example, the polyphase factor depicted in FIG. 3B is eight. The polyphased clock generator 276 includes multiple clocks running at the same frequency with predetermined phase relationships to generate the polyphased clock signal. In the depicted embodiment, the polyphased clock generator 276 includes eight clocks respectively providing clock signals at 45 degree phase intervals, such that the polyphased clock signal is polyphased by a factor of eight. The clock phases are 0 degrees, 45 degrees, 90 degrees, 135 degrees, 180 degrees, 225 degrees, 270 degrees and 315 degrees. Because of the polyphased design, time intervals of $\frac{1}{8}^{th}$ of the clock period can be resolved.

The counter bank 277 includes eight fast counters (Counter 1 to Counter 8) configured to receive the clock signals from the eight clocks having the different clock phases, and to receive a counter enable signal from the zero-crossing detector 271. The counter enable signal triggers counting based on the detected zero crossings. The timing of the zero crossings is thus identified at higher resolution due to the different clock phases driving the eight counters. The digital logic circuit 278 is configured to calculate a modified period of the VCO signal at the higher resolution by identifying for each combination of edges which of the eight counters is first triggered for the starting edge and which of the eight counters is first triggered for the ending edge of the period. The processing unit 275 is configured to determine the frequency of the VCO signal based on the inverse of the modified period provided by the digital logic circuit 278, and to determine the numeric values corresponding to the voltage levels of the analog input voltage waveform based on the frequency of the VCO signal, as discussed above. In this way, the detection circuit 270B operates as if the clock frequency were eight times faster.

Use of the polyphased time interval detector 272 relies on enabling each of the fast counters on one edge of the VCO signal (indicated by a zero crossing) and stopping each of the counters on the next edge of the VCO signal (indicated by a next consecutive zero crossing of a corresponding rising or falling edge). The value of the obtained period duration count is proportional to the frequency. As an example, the polyphased clock generator 276 may be a 500 MHz clock, is polyphased by a factor of eight, as discussed above. In this case, the polyphased time interval detector 272 improves the resolution of the time interval measurement from 2 ns down to 250 ps, emulating a 4 GHz clock.

Figure 4:
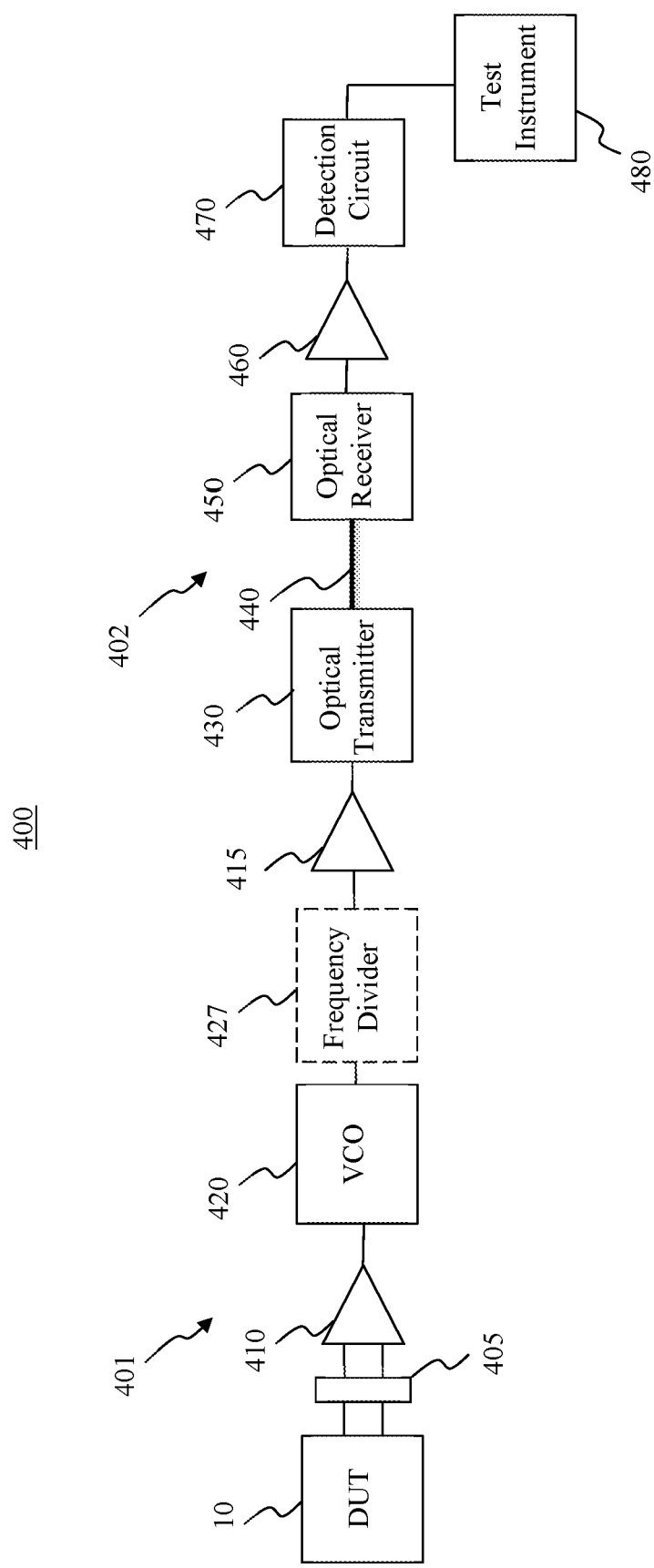
FIG. 4 is a simplified block diagram of a system for measuring voltage in a DUT using a VCO, according to a representative embodiment.

FIG. 4 is a simplified block diagram of a system for measuring voltage in a DUT using a VCO, according to a representative embodiment.

Referring to FIG. 4, system 400 includes a transmit side circuit 401 and a receive side circuit 402 connected the transmit side circuit 401 by an optical link 440. The transmit side circuit 401 is configured to output an optical frequency modulated signal representative of an input voltage waveform received from a DUT 10, and the receive side circuit 402 is configured to convert the optical frequency mapped signal received to a voltage that can be measured by a test instrument 480, such as an oscilloscope, a spectrum analyzer, or a digital multimeter, for example.

The transmit side circuit 401 of the system 400 includes a differential amplifier 410, a VCO 420, and an optional frequency divider 427, which may be the same as the differential amplifier 210, the VCO 220 and the frequency divider 227 discussed above with reference to FIG. 2. The differential amplifier 410 is configured to receive and buffer or amplify an analog input voltage waveform from the DUT 10 through a probe 405 and an optional attenuation and protection circuit (not shown). The input voltage waveform may be a differential signal or a single-ended single.

The VCO 420 is configured to receive the amplified analog input voltage waveform, and to output a VCO signal, which is an FM clock signal having a frequency that is mapped to the input voltage waveform. That is, as voltage level of the input voltage signal changes, the frequency output by the VCO 420 changes proportionately as a function of the voltage level, such that the frequency of the VCO signal is indicative of the voltage level.

The VCO 420 produces the VCO signal at a frequency that is at least twice the frequency of a required measurement bandwidth in order to meet Nyquist constraints. For example, the VCO signal frequency may be about 2.5 that of the required measurement bandwidth, although the frequency of the VCO signal in relation to the measurement bandwidth may vary to provide unique benefits for any particular situation or to meet application specific design requirements of various implementations, as would be apparent to one skilled in the art. Accordingly, the VCO 420 is able to provide a frequency signal having a very large tuning bandwidth that extends from DC to hundreds of MHz or tens of GHz.

Figure 5:
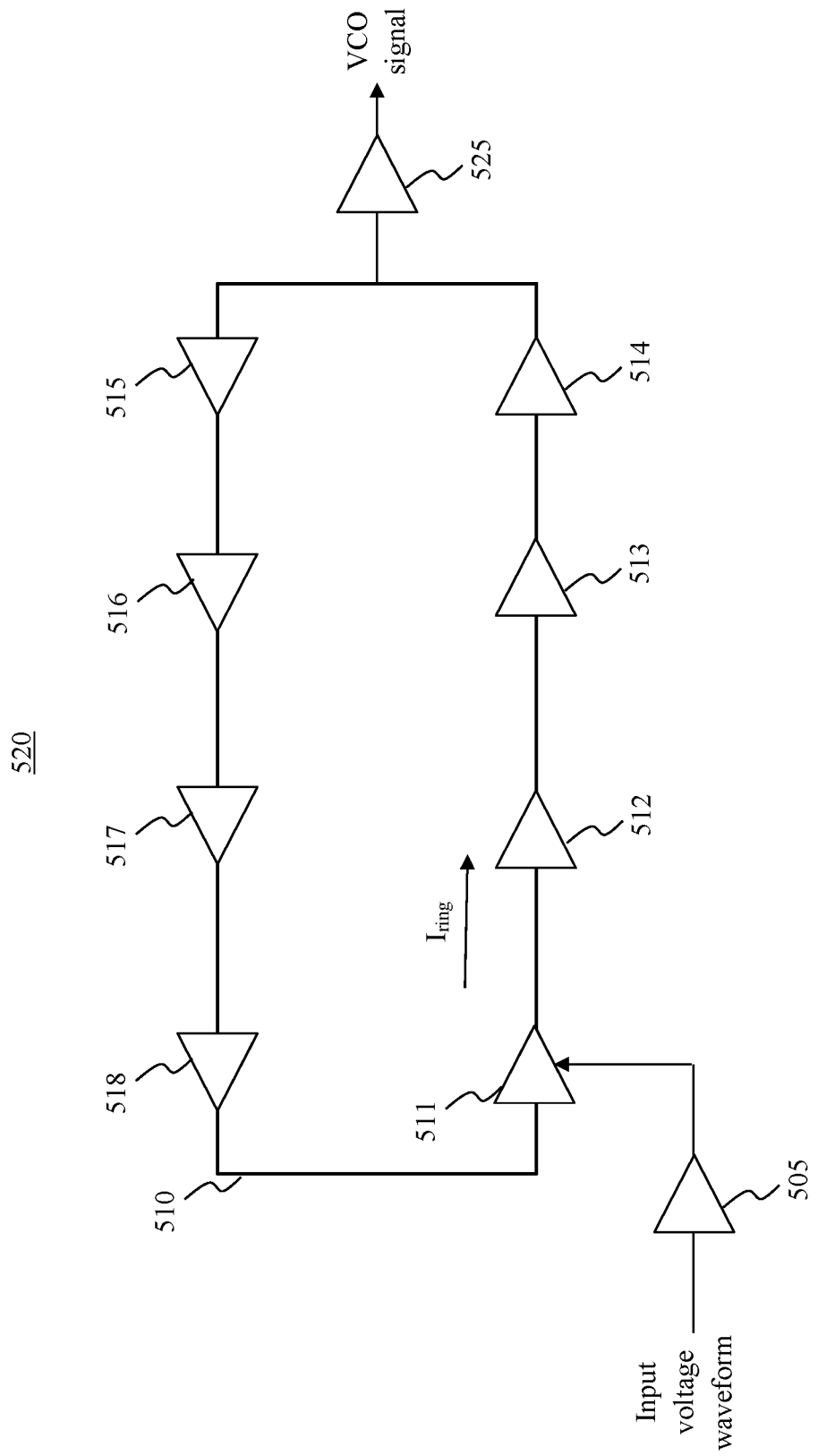
FIG. 5 is a simplified block diagram of a ring oscillator VCO, according to a represented embodiment.

As mentioned above, in an embodiment, the VCO 420 may be a ring oscillator VCO. A ring oscillator VCO includes multiple buffers arranged in series to form a ring, and is able to change frequencies very quickly, e.g., as compared to conventional inductor-capacitor (LC) oscillators, thereby having a large tuning bandwidth. The ring oscillator VCO also enables wideband sensing. FIG. 5 is a simplified block diagram of a ring oscillator VCO, according to a represented embodiment.

Referring to FIG. 5, ring oscillator VCO 520 includes eight buffers (or logic gates) 511, 512, 513, 514, 515, 516, 517 and 518 arranged in in series in a ring 510. The ring oscillator VCO 520 may also include interface circuits (not shown) between consecutive buffers 511-518 connecting the output from one buffer to the input of the following buffer. Of course, the number of buffers and interface circuits may vary to provide unique benefits for any particular situation or to meet application specific design requirements of various implementations, as would be apparent to one skilled in the art. The input voltage waveform is input to the ring 510 via an input buffer 505 and is consecutively buffered and shared with each of the buffers 511-518 in the ring 510 in order to modulate current in all the buffers 511-518. The VCO signal generated by the ring oscillator VCO 520 is output at an optional output buffer 525. The ring oscillator VCO 520 is a small circuit and consumes little power.

In an embodiment, the buffers 511-518 are differential buffers, each of which is based on field-effect transistor (FET) differential pairs and a fast-current source for producing buffer current ($I_{ring}$). The current source on each differential FET pair performs a frequency tuning function. Of course, in an alternative embodiment, the buffers 511-518 may be single-ended buffers, without departing from the scope of the present teachings.

Referring again to FIG. 4, when the frequency divider 427 is included, it is configured to divide down the frequency of the VCO signal output by the VCO 420 before the VCO signal is input to the optical transmitter 430. By dividing down the VCO signal frequency, the frequency divider 427 reduces phase noise and related time-domain jitter of the raw VCO signal. Also, when the optical transmitter 430 is implemented as a laser diode, for example, and the frequency divider 427 lowers the frequency of the VCO signal, making it feasible for direct modulation of the laser diode.

The transmit side circuit 401 further includes an RF amplifier 415 and an optical transmitter 430. The RF amplifier 415 is configured to drive the optical transmitter 430 (e.g., a laser diode) with the VCO signal, which is output by the VCO 420 or by the frequency divider 427 at a lower frequency. The optical transmitter 430 is configured to convert the amplified VCO signal to an optical pulse signal having a pulse rate equal to the frequency of the VCO signal. The optical transmitter 430 may be a directly modulated laser diode or a constant output laser diode coupled to an optical modulator, for example, although any compatible type of optical transmitter 430 that can produce the desired frequency modulated optical pulse train from the VCO signal output by the VCO 420 (or optionally the frequency divider 427) may be implemented without departing from the scope of the present teachings. When optical transmitter 430 is a laser diode, the laser diode is directly modulated by the VCO signal to output the optical pulse signal, as mentioned above. The output of the optical transmitter 430 is connected to the optical link 440, which is configured to transmit the optical pulse signal to the receive side circuit 402. The optical link 440 may be the same as the optical link 140, discussed above.

The receive side circuit 402 includes an optical receiver 450, a transimpedance amplifier (TIA) 460, and a detection circuit 470. The optical receiver 450 is configured to receive the optical pulse signal over the optical link 440, and to convert the optical pulse signal to an electrical signal, such as an electrical current. The optical receiver 450 may be a photo diode or any other optical sensor that can convert the received optical pulse signal back into an electrical signal. Any compatible type of optical receiver 450 may be implemented without departing from the scope of the present teachings. The TIA 460 is configured to convert the electrical current to a voltage signal, and may also amplify the voltage signal. In various embodiments, the TIA 460 may be replaced by any compatible current to voltage converter, such as a resistor, for example, configured to convert the current signal into the voltage signal.

As mentioned above, the transmit side circuit 401 may be operating on a high voltage floating environment, while the receive side circuit 402 still may be at ground level since the optical link 440 does not conduct electrical current. Also, the optical link 440 supports simultaneous transmission of different wavelengths of light, each of which may contain a VCO signal from an independent probe or input voltage waveform. Copies of the VCO signal are easy to create with little additional error, thus supporting applications in which one probed input voltage waveform is to be transmitted to multiple locations.

The detection circuit 470 may be the same as the detection circuit 270, discussed above with reference to FIG. 2. In this case, the detection circuit 470 receives the voltage signal output by the TIA 460, and converts the voltage signal to numeric values that correspond to the voltage levels of the input voltage waveform based on the frequency of the VCO signal. Accordingly, in various embodiments, the detection circuit 470 may be implemented as the detection circuit 270A or the detection circuit 270B described above with reference to FIGS. 3A and 3B, respectively, for example.

The output of the detection circuit 470, and thus the system 400, is the numeric values corresponding to the voltage levels of the analog input voltage waveform. The numeric values may be provided to the test instrument 480 for performing measurements and other processing and/or display. Also, the test instrument 480 may generate an output voltage waveform corresponding to the input voltage waveform using the numeric values. Because of the galvanic isolation of the optical link 440, the test instrument 480 may be a standard oscilloscope operating at ground level, for example, which is able to perform wideband measurements even when the DUT 10 operates at very high voltages, as discussed above with reference to the test instrument 180.

Figure 6:
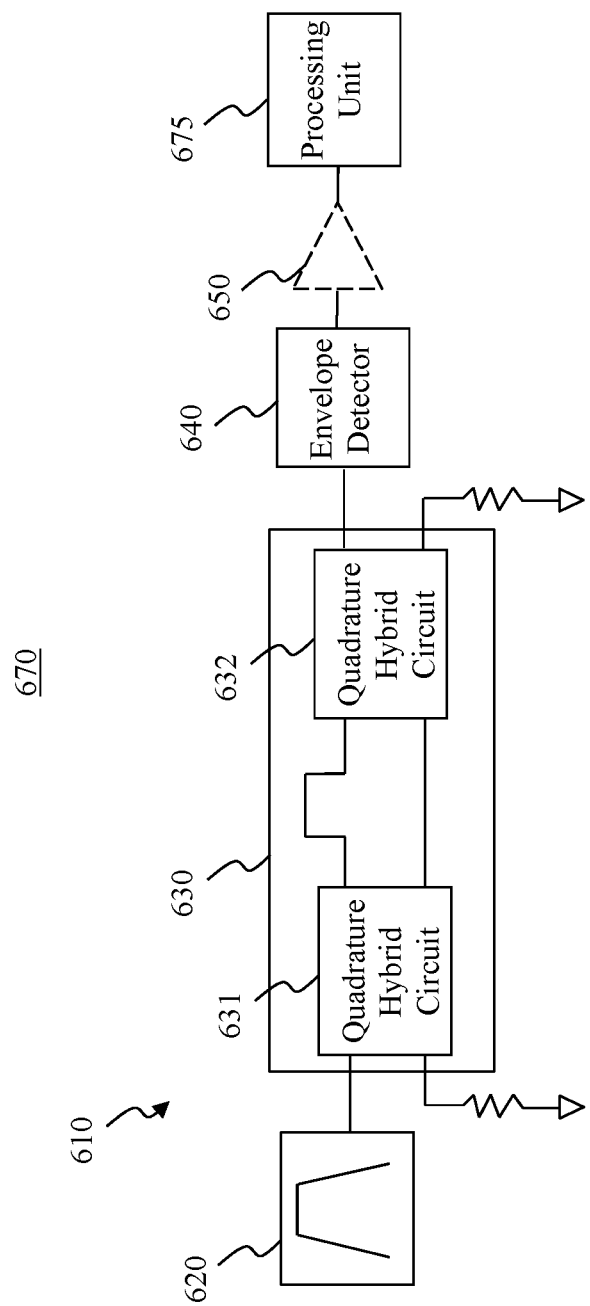
FIG. 6 is a simplified block diagram of a detection circuit configured to provide an output voltage waveform corresponding to an input voltage waveform, according to a representative embodiment

In an alternative embodiment, the detection circuit 470 is configured to output a voltage waveform corresponding to the input voltage waveform originally provided by the DUT 10, thereby recovering the input voltage waveform, as opposed to providing numeric values corresponding to voltage levels of the input voltage waveform, as discussed above. FIG. 6 is a simplified block diagram of a detection circuit configured to provide an output voltage waveform, according to a representative embodiment.

Referring to FIG. 6, detection circuit 670 includes a frequency detector 610 and a processing unit 675, which is substantially the same as the processing unit 275 discussed above, so the description will not be repeated. In radar applications, the frequency detector 610 may be referred to as a wideband frequency discriminator. The frequency detector 610 is configured receive the electrical constant amplitude frequency modulated voltage waveform from the optical receiver 450 and the TIA 460, and to convert the constant amplitude frequency modulated voltage waveform to an amplitude varying frequency modulated voltage waveform, where the amplitude is proportional to that of the original input voltage waveform received from the DUT 10 and the frequency remains unchanged. The processing unit 675 is configured to produce the output voltage waveform from the peak voltage provided by an envelope detector 640, discussed below, where the output voltage waveform corresponds to the input voltage waveform originally provided by the DUT 10. The processing unit 675 may produce the output voltage waveform using offset removal, or a look-up table for gain scaling and making non-linear corrections to the corresponding voltage. Alternatively, the processing unit 675 may calculate the gain scaling using a predetermined algorithm (e.g., a polynomial). There is an inherent offset to be removed since the frequency from the VCO 420 will never be zero, even with a zero-volt input. Also, typical frequency discriminators experience non-linear gain roll-off at the upper frequencies, that can be corrected for with a static predetermined gain correction which can be implemented as a look-up table or a polynomial. The use of a look-up table and a predetermined algorithm to generate the output voltage waveform based on voltage input is well known in the art. All or part of the functionality of the frequency detector 610 and/or the processing unit 675 may be implemented by the test instrument 480, without departing from the scope of the present teachings.

In the depicted embodiment, the frequency detector 610 includes a bandpass filter 620, a frequency discriminator 630, an envelope detector 640, and an optional buffer amplifier 650. The bandpass filter 620 is configured to filter electrical noise received from the optical receiver 450 and the TIA 460 in order to reduce system noise. The bandpass filter 620 passes only the bandwidth needed for signal reconstruction. Undesired out of band noise is filtered out, improving the system dynamic range.

The frequency discriminator 630 is configured to generate a quadrature modulated signal from the filtered electrical signal. The frequency discriminator 630 includes a pair of quadrature hybrid circuits, indicated by first quadrature hybrid circuit 631 and second quadrature hybrid circuit 632, connected by delay lines such that the second quadrature hybrid circuit 632 receives signals from the first quadrature hybrid circuit 631 having a phase difference of 90 degrees at the frequency of the VCO signal corresponding to zero volts at the tuning input of the VCO 420. In the depicted example, the second quadrature hybrid circuit 632 receives two 2.5 GHz signals from the first quadrature hybrid circuit 631 with phases of 90 degrees and 270 degrees (induce by the delay line), and outputs the quadrature modulated signal. The envelope detector 640 is configured to convert the quadrature modulated signal to an output voltage waveform approximating the input voltage waveform by peak detection methods. The buffer amplifier 650 may be included to facilitate impedance matching with the test instrument 480.

The test instrument 480 may be configured to perform measurements and other processing on the output voltage waveform. The test instrument 480 may include a display configured to display the output voltage waveform. Again, because of the optical link 440, the test instrument 480 may be a standard oscilloscope, for example, which is able to perform wideband measurements even when the DUT 10 operates at very high voltages, as discussed above with reference to the test instrument 180.

Generally, the architecture of the various embodiments contains no bandwidth limiting feedback paths, such as PLLs or other commercially available frequency to voltage converters, which would otherwise limit measurement bandwidth and speed. For example, without the feedback paths, the measurement bandwidth may exceed 100 MHz, and to achieve tens of GHz of bandwidth, as needed. As discussed above, the Nyquist constraint is that the clock rate of the VCO 420 must be at least twice the frequency of the measurement bandwidth of the system 400, is typically closer to about 2.5 times the frequency of the measurement bandwidth to allow for non-zero lowpass filter transition bandwidth, for example. Also, ring oscillator VCOs are able to support wideband tuning, which conventional LC VCOs cannot.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

Aspects of the present invention may be embodied as an apparatus, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit" or "system." Furthermore, aspects of the present invention may take the form of a computer program product embodied in one or more computer readable medium(s) having computer executable code embodied thereon.

While representative embodiments are disclosed herein, one having ordinary skill in the art appreciates that many variations that are in accordance with the present teachings are possible and remain within the scope of the appended claim set. The invention therefore is not to be restricted except within the scope of the appended claims.

The invention claimed is:

1. A system for measuring voltage, comprising:
   a pulse-width modulator configured to receive an input voltage waveform from a device under test (DUT), and to output a pulse-width modulated (PWM) signal mapped to the input voltage waveform;
   an optical transmitter configured to be modulated by the PWM signal to output an optical pulse signal having pulse widths corresponding to pulse widths of the PWM signal;
   an optical receiver configured to receive the optical pulse signal over an optical link and to convert the optical pulse signal to an electrical current;
   a current to voltage converter configured to convert the electrical current to a voltage signal; and
   at least one filter configured to filter the voltage signal to recover the input voltage waveform from the DUT.

2. The system of claim 1, further comprising:
   a clock oscillator configured to generate a clock signal for driving the pulse-width modulator, wherein the clock signal has a constant clock frequency at least twice the frequency of a required measurement bandwidth to meet Nyquist constraints.

3. The system of claim 2, wherein the at least one filter comprises a low-pass filter configured to block portions of the voltage signal having frequency components greater than or equal to one half of the constant clock frequency.

4. The system of claim 2, wherein the constant clock frequency of the clock signal is at least 2.5 times the frequency of the required measurement bandwidth.

5. The system of claim 1, wherein the optical transmitter comprises a laser diode which is directly modulated by the PWM signal, and the optical receiver comprises a photo diode.

6. A system for measuring voltage, comprising:
   a voltage controlled oscillator (VCO) configured to receive an analog input voltage waveform from a device under test (DUT), and to output a VCO signal having a frequency mapped to the analog input voltage waveform, wherein frequency of the VCO signal is at least twice a required measurement bandwidth of the analog input voltage waveform; and
   a detection circuit configured to convert the VCO signal to numeric values, corresponding to voltage levels of the analog voltage input waveform from the DUT, based on the frequency of the VCO signal.

7. The system of claim 6, wherein the detection circuit comprises:
   a zero-crossing detector configured to detect zero crossings of the VCO signal to identify a period of the VCO signal; and
   a processing unit configured to determine the frequency of the VCO signal based on the period, and to determine the numeric values corresponding to the voltage levels of the analog input voltage waveform from the determined frequency using a look-up table or a predetermined algorithm.

8. The system of claim 6, wherein the detection circuit comprises:
   a zero-crossing detector configured to detect zero crossings of the VCO signal to identify a period of the VCO signal;
   a polyphased time interval detector configured to improve resolution of measurement of the period of the VCO signal; and
   a processing unit configured to determine the frequency of the VCO signal based on the period, and to determine the numeric values corresponding to the voltage levels of the analog input voltage waveform from the frequency using a look-up table or a predetermined algorithm.

9. The system of claim 8, wherein the polyphased time interval detector comprises:
   a polyphased clock generator comprising a plurality of clocks running with predetermined phase relationships, and configured to generate a polyphased clock signal providing higher timing resolution, which is less than a single clock interval;
   a plurality of counters configured to receive different phases of the polyphased clock signal from the plurality of clocks, respectively, and to receive the period of the VCO signal from the zero-crossing detector as a counter enable signal; and
   a digital logic circuit configured to calculate the period of the VCO signal with the higher timing resolution, and to output the calculated period of the VCO signal to be provided to the processing unit.

10. A system for measuring voltage, comprising:
a voltage controlled oscillator (VCO) configured to receive an input voltage waveform from a device under test (DUT), and to output a VCO signal having a frequency mapped to the input voltage waveform, wherein the frequency of the VCO signal is at least twice a required measurement bandwidth of the input voltage waveform;
an optical transmitter configured to be modulated by the frequency of the VCO signal to output an optical pulse signal having a pulse rate equal to the frequency of the VCO signal;
an optical receiver configured to receive the optical pulse signal over an optical link and to convert the optical pulse signal to an electrical current;
a current to voltage converter configured to convert the electrical current to a voltage signal corresponding to the VCO signal; and
a detection circuit configured to convert the voltage signal into an output voltage waveform having the same frequency as the VCO signal, or to convert the voltage signal to numeric values corresponding to voltage levels of the input voltage waveform.

11. The system of claim 10, wherein the VCO comprises a ring oscillator VCO.

12. The system of claim 11, further comprising:
a differential amplifier configured to receive a voltage signal from the DUT, and to output a differential voltage signal as the input voltage waveform to be received by the VCO,
wherein the ring oscillator VCO comprises a plurality of differential buffers.

13. The system of claim 10, wherein the detection circuit comprises:
a zero-crossing detector configured to detect zero crossings of the voltage signal to identify a period of the voltage signal; and
a processing unit configured to determine the frequency of the voltage signal based on the period, and to determine the numeric values corresponding to the voltage levels of the input voltage waveform from the determined frequency using a look-up table or a predetermined algorithm.

14. The system of claim 10, wherein the detection circuit comprises:
a zero-crossing detector configured to detect zero crossings of the voltage signal to identify a period of the voltage signal;
a polyphased time interval detector configured to improve resolution of measurement of the period of the voltage signal; and
a processing unit configured to determine the frequency of the voltage signal based on the period, and to determine the numeric values corresponding to the voltage levels of the input voltage waveform from the frequency using a look-up table or a predetermined algorithm.

15. The system of claim 14, wherein the polyphased time interval detector comprises:
a polyphased clock generator comprising a plurality of clocks running with predetermined phase relationships, and configured to generate a polyphased clock signal providing a higher timing resolution, which is less than a single clock interval;
a plurality of counters configured to receive different phases of the polyphased clock signal from the plurality of clocks, respectively, and to receive the period of the voltage signal from the zero-crossing detector as a counter enable signal; and
a digital logic circuit configured to calculate the period of the voltage signal at the improved resolution, and to output the calculated period of the voltage signal to be provided to the processing unit.

16. The system of claim 10, wherein the detection circuit comprises:
a frequency detector configured to convert the voltage signal received from the current to voltage converter to a corresponding time period; and
a processing unit configured to produce the input voltage waveform from the corresponding time period, using offset removal, using a look-up table for gain scaling and making non-linear corrections to the corresponding voltage, or using a predetermined algorithm.

17. The system of claim 16, wherein the frequency detector comprises:
a bandpass filter configured to filter the voltage signal received from the current to voltage converter;
a frequency discriminator comprising a pair of quadrature hybrid circuits and properly designed delay lines configured to generate a quadrature modulated signal from the filtered voltage signal; and
an envelope detector configured to convert peak value of the quadrature modulated signal to a recovered analog waveform approximating the input voltage waveform.

18. The system of claim 10, further comprising:
at least one frequency divider configured to divide down the frequency of the VCO signal output by the VCO before directly modulating the optical transmitter.

19. The system of claim 10, wherein the optical link enables measuring the input voltage waveform floating on a high voltage and/or transporting the optical pulse signal over a long distance.

20. The system of claim 10, wherein the optical transmitter comprises a laser diode that is directly modulated by the frequency of the VCO signal, and the optical receiver comprises a photo diode followed by the current to voltage converter to produce the voltage signal having the same frequency as the optical pulse signal.

* * * * *